United States Patent
Taracila et al.

(10) Patent No.: US 9,304,178 B2
(45) Date of Patent: Apr. 5, 2016

(54) SYSTEMS AND METHODS FOR COIL ARRANGEMENTS IN MAGNETIC RESONANCE IMAGING

(75) Inventors: Victor Taracila, Beachwood, OH (US); Fraser Robb, Aurora, OH (US); Robert Steven Stormont, Hartland, WI (US)

(73) Assignee: General Electric Company, Schenectady, NY (US)

( * ) Notice: Subject to any disclaimer, the term of this patent is extended or adjusted under 35 U.S.C. 154(b) by 755 days.

(21) Appl. No.: 13/476,914

(22) Filed: May 21, 2012

(65) Prior Publication Data

US 2013/0307540 A1    Nov. 21, 2013

(51) Int. Cl.
  *G01V 3/00*     (2006.01)
  *G01R 33/34*    (2006.01)
  *G01R 33/32*    (2006.01)
  *G01R 33/3415*  (2006.01)
  *G01R 33/48*    (2006.01)

(52) U.S. Cl.
  CPC .......... *G01R 33/34007* (2013.01); *G01R 33/32* (2013.01); *G01R 33/34084* (2013.01); *G01R 33/3415* (2013.01); *G01R 33/481* (2013.01)

(58) Field of Classification Search
  CPC ...................................................... G01R 33/32
  USPC .................................. 324/318, 322, 321, 319
  See application file for complete search history.

(56) References Cited

U.S. PATENT DOCUMENTS

| | | | |
|---|---|---|---|
| 7,602,186 B2 * | 10/2009 | Hoogeveen | 324/318 |
| 7,663,366 B2 * | 2/2010 | Takamori | 324/318 |
| 2002/0138001 A1 | 9/2002 | Kroeckel | |
| 2005/0080333 A1 | 4/2005 | Piron et al. | |
| 2005/0134272 A1 | 6/2005 | Roberts et al. | |
| 2007/0016003 A1 | 1/2007 | Piron et al. | |
| 2008/0015430 A1 | 1/2008 | Takamori | |
| 2009/0027053 A1 | 1/2009 | Decke et al. | |
| 2009/0306494 A1 | 12/2009 | Scarth et al. | |
| 2010/0135559 A1 | 6/2010 | Morich et al. | |

FOREIGN PATENT DOCUMENTS

| | | |
|---|---|---|
| CN | 1803093 | 7/2006 |
| CN | 1918478 | 2/2007 |
| CN | 101103916 | 1/2008 |

OTHER PUBLICATIONS

Search Report and Written Opinion from PCT Application No. PCT/US2013/038442 dated Jul. 12, 2013.

* cited by examiner

*Primary Examiner* — Louis Arana
(74) *Attorney, Agent, or Firm* — Dean D. Small; The Small Patent Law Group, LLC

(57) ABSTRACT

Systems and methods for coil arrangements in Magnetic Resonance Imaging (MRI) are provided. One coil arrangement includes a magnet bore, a radio-frequency (RF) transmit coil coupled to the magnet bore, and at least one RF receive coil coupled to the magnet bore. The RF receive coil is movable within the magnet bore.

17 Claims, 8 Drawing Sheets

US 9,304,178 B2

SYSTEMS AND METHODS FOR COIL ARRANGEMENTS IN MAGNETIC RESONANCE IMAGING

BACKGROUND OF THE INVENTION

The subject matter disclosed herein relates generally to Magnetic Resonance Imaging (MRI) systems, and more particularly to systems and methods for arranging coils for MRI.

MRI systems include a magnet, such as a superconducting magnet that generates a temporally constant (i.e., uniform and static) primary or main magnetic field. MRI data acquisition is accomplished by exciting magnetic moments within the primary magnetic field using radio-frequency (RF) coils. For example, in order to image a region of interest, the magnetic gradient coils are energized to impose a magnetic gradient to the primary magnetic field. RF transmit coils are then pulsed to create RF magnetic field pulses in a bore of an MRI scanner in order to acquire MR images of the region of interest using, for example, a phased array of RF receive coils. The resultant image that is generated shows the structure and function of the region of interest.

The receive coils are typically patient centric. In particular, the receive coils are positioned around the patient or portion of the patient to be imaged. For example, when imaging the head, shoulder, knee, wrist, etc. of the patient with specially designed receive coils, the patient has to be scanned in segments or stages. This stepwise scan adds time and complexity to the imaging process. Additionally, some of the channels of the receive coils (e.g., surface body coils) are outside of the field-of-view (FOV) of the system. However, only the receive coils or portions of the coil within the FOV generate MRI data. Moreover, these receive coils, in particular anterior receive coils, have to be sized differently to accommodate different sized patients.

BRIEF DESCRIPTION OF THE INVENTION

In accordance with various embodiments, a coil arrangement for a Magnetic Resonance Imaging (MRI) system is provided. The coil arrangement includes a magnet bore, a radio-frequency (RF) transmit coil coupled to the magnet bore, and at least one RE receive coil coupled to the magnet bore. The RF receive coil is movable within the magnet bore.

In accordance with other embodiments, a magnetic resonance imaging (MRI) system is provided that includes an imaging portion having a magnet bore and a radio-frequency (RF) transmit coil coupled to the magnet bore. The MRI system also includes an anterior RF receive coil and a posterior RE receive coil coupled to the magnet bore, wherein the anterior and posterior RF receive coils are movable within the magnet bore along an examination axis. The anterior RF receive coil is further movable radially within the magnet bore.

In accordance with yet other embodiments, a method of medical imaging is provided. The method includes acquiring Magnetic Resonance (MR) data using a transmit coil coupled to a Magnetic Resonance Imaging (MRI) magnet bore and at least one receive coil movably coupled to the MRI magnet bore. The receive coil is movable along an examination axis of the MRI magnet bore.

DETAILED DESCRIPTION OF THE INVENTION

Figure 1:
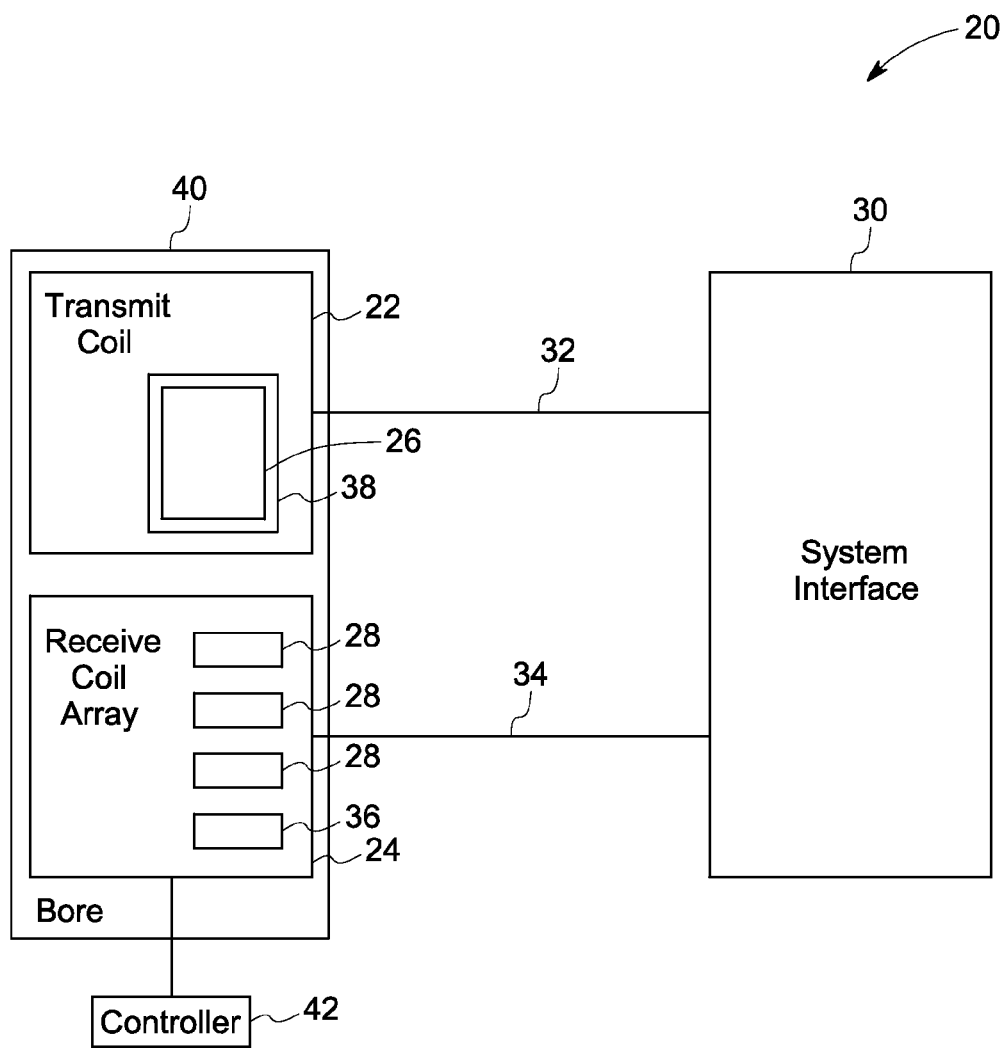
FIG. 1 is a block diagram of a transmit/receive section of a Magnetic Resonance Imaging (MRI) system in accordance with various embodiments.

The foregoing summary, as well as the following detailed description of certain embodiments, will be better understood when read in conjunction with the appended drawings. To the extent that the figures illustrate diagrams of the functional blocks of various embodiments, the functional blocks are not necessarily indicative of the division between hardware circuitry. Thus, for example, one or more of the functional blocks may be implemented in a single piece of hardware or multiple pieces of hardware. It should be understood that the various embodiments are not limited to the arrangements and instrumentality shown in the drawings.

As used herein, an element or step recited in the singular and proceeded with the word "a" or "an" should be understood as not excluding plural of said elements or steps, unless such exclusion is explicitly stated. Furthermore, references to "one embodiment" are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

Various embodiments provide systems and methods for coil arrangements in Magnetic Resonance Imaging (MRI). In some embodiments, all of the radio-frequency (RF) coils for performing MRI are maintained within the bore of the MRI system. In particular, in various embodiments, a patient is moved on a table while the RF coils, specifically the RF transmit and receive coils remain in the bore of the MRI system. The RF coils are movable and also allow for the same coil elements to be used for imaging the entire patient body. For example, one or more of the receive RF coils may be moved out of the field of view (FOV) of the imaging system components while remaining within the bore of the MRI system. Accordingly, RF coils that are not in use may be moved out of the FOV.

Various embodiments may be implemented in connection with an MRI system, a block diagram of a transmit/receive section 20 of an MRI system is illustrated in FIG. 1. The transmit/receive section 20 is configured to acquire MR data using one or more coils, in particular RF coils. In the illustrated embodiment, a transmit coil 22 (e.g., a body coil) and a receive coil array 24 are provided within a bore 40 of the MRI system, which may also be referred to as the magnet bore. The receive coil array 24 is movable within the bore 40. In various embodiments, the movement of the receive coil array 24 is provided such that the coils move within the bore 40 and remain therein. Accordingly, the receive coil array 24 is movable within the bore 40 and does not move outside the bore 40 as described in more detail herein. In some embodiments, the receive coil array 24 is configured to translate within the bore 40 to at least one end of the bore 40. It should be noted that the movement of the receive coil array 24 may be limited by a limiter on a controller 42 that controls the movement of the receive coil array 24. In other embodiments, mechanical stops (not shown) may be provided, for example, at the ends of the bore 40.

In the illustrated embodiment, the transmit coil 22 includes a single RF coil 26 and the receive coil array 24 includes a plurality of plurality of individual RF coils 28. For example, in one embodiment, the transmit coil 22 is an RF body coil, such as an RF birdcage coil. The RF body coil may be used as a whole-body RF coil. For a whole-body RF coil, the dimensions of the RF body coil are configured so that the RF body coil may be installed inside a superconducting magnet assembly or inside the bore 40 of the MRI system. The receive coil array 24 in various embodiments is also configured to provide whole body imaging. In some other embodiments, the transmit coil 22 or the receive coil array 24 may be a local coil (e.g., a head coil or knee coil). It also should be noted that in some embodiments, one or more individual or single receive RF coils 28 are provided instead of or in addition to the receive coil array 24.

The transmit coil 22 and receive coil array 24 within the bore 40 are coupled to a system interface 30. In operation, the transmit coil 22 is configured to transmit RF pulses and the receive coil array 24 is configured to detect the MR signals, such as from a patient or a portion of the patient within the bore 40. In some embodiments, only a single coil array is provided, such that the coil array is configured to transmit RF pulses and also detect MR signals from the patient. It should be noted that an RF shield 38 may be provided around the transmit coil 22 to prevent the RF fields from penetrating the gradient coils (not shown) on the outside of the transmit coil 22, for example, on the outside of the body coil.

One or more connections or links are used to connect the transmit coil 22 and receive coil array 24 to the system interface 30. For example, in one embodiment, one or more transmission lines 32 and 34 (e.g., coaxial cables) connect the transmit coil 22 and receive coil array 24 to the system interface 30. It should be noted that single transmission lines 32 and 34 are shown interconnecting the transmit coil 22 and receive coil array 24 with the system interface 30 for simplicity. However, in various embodiments, multiple transmission lines 32 and/or 34 may be used, such as depending on the number of coils used, the number of channels, etc. It should be noted that the transmission lines are not limited to coaxial cables, but may be any type of transmission line, for example, a stripline or microstripline.

Figure 2:
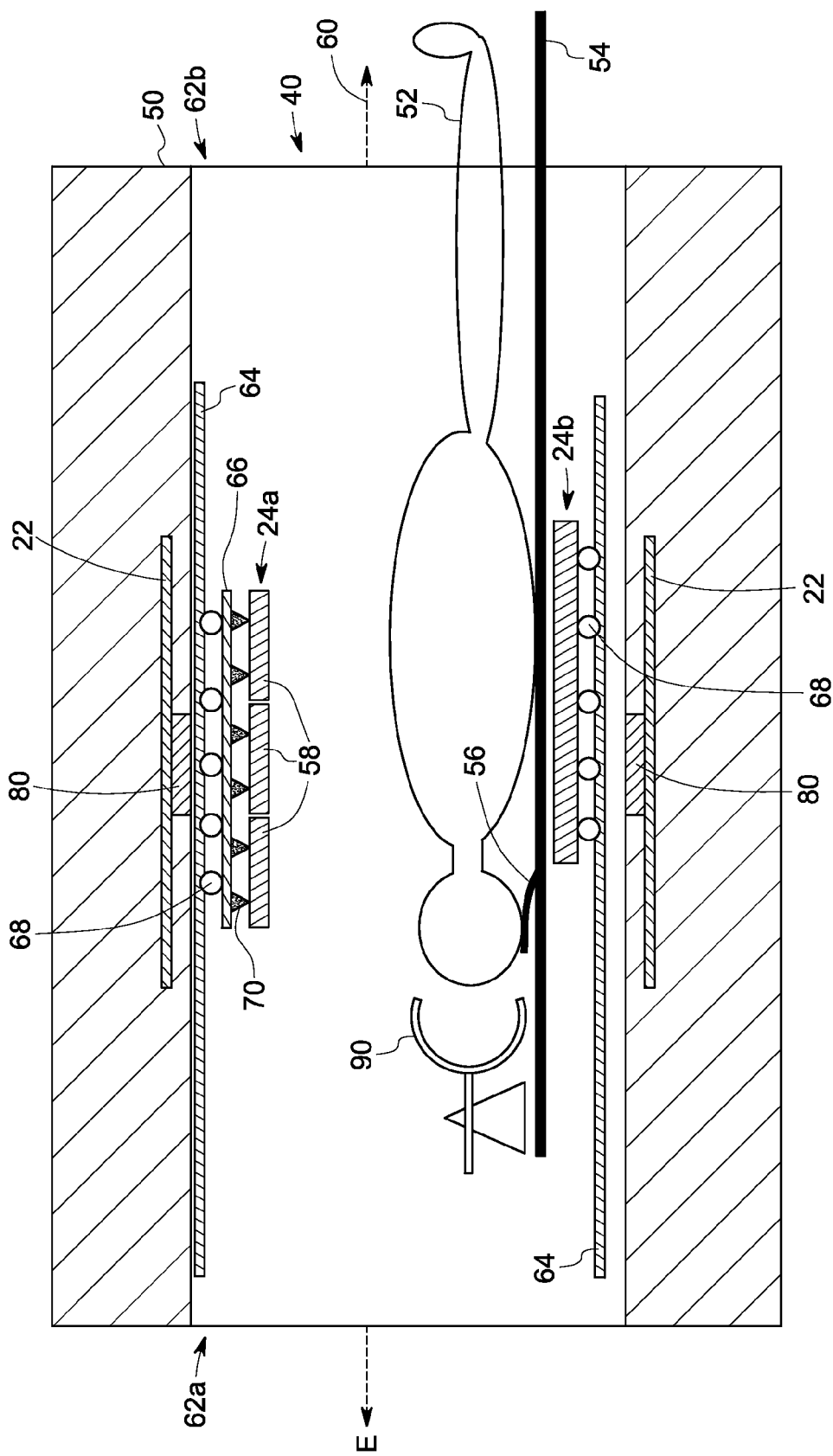
FIG. 2 is a schematic diagram of a coil arrangement in accordance with various embodiments.

More particularly, in one embodiment, as illustrated in FIG. 2, the bore 40 is formed within the magnet 50, such that an examination axis (E) 60 is defined therethrough. The magnet 50 may be any type of MRI magnet structure, which may include, for example, wires wound around a former or wires forming a self-supporting structure. The wires may define a plurality of coils around a former (or in a self-supporting arrangement) forming a superconducting magnet. As can be seen, a patient 52, which may include the entire patient 52, substantially all of the patient 52 or a portion of the patient 52, may be moved into the bore 40. For example, the patient may be supported on a table 54 that is movable within the bore 40 and along the examination axis 60. The table 54 may be a motorized table or may be a manually movable table. Also, only a portion of the table 54 may move into the bore 40, such as a cradle on a top of the table 54. It should be noted that the magnet 50 may generally define an outer structure with gradient coils (not shown in FIG. 2) positioned radially inward therefrom and the RF coils positioned radially inward from the gradient coils. As can be seen the receive coil array 24a and receive coil array 24b are positioned radially inward from the transmit coil 22.

In the illustrated embodiment, the transmit coil 22 is fixedly mounted, for example, within the bore 40. For example, the transmit coil 22 may be a body or birdcage coil that is fixedly mounted in relation to the bore 40 such that the transmit coil 22 does not move. It should be noted that the transmit coil 22 may be sized as desired or needed, for example, in one embodiment the transmit coil 22 has a width of between about 70 centimeters (cm) and 80 cm. Also, it should be noted that although the transmit coil 22 is shown as mounted and positioned generally at a middle of the bore 40 equidistance from ends 62 of the bore 40, the transmit coil 22 may be positioned at other axial locations along the examination axis 60 within the bore 40. Additionally, in some embodiments, the transmit coil 22 may be used for receive operation to receive MR data. In this embodiment, the transmit coil 22 is a transmit and receive coil In the illustrated embodiment, the receive coil array 24a includes a plurality of individual coil array portions 58 that are separately positionable radially within the bore 40 as described in more detail herein. Each of the receive coil arrays 24a and 24b, as well as the coil array portions 58 may be formed from sets of coils (e.g., loop or saddle coils) that define the array. However, it should be appreciated that in some embodiments, one or more of the coil structures may be formed from a single coil.

The receive coil arrays 24a and 24b and/or the coil array portions 58 may be formed from different sized and shaped coil elements that may be planar or non-planar. For example, in some embodiments one or more of the receive coil arrays 24a and 24b and/or the coil array portions 58 may include curved coil elements, such as to conform to the body of the patient 52.

In the illustrated embodiment, the receive coil array 24a defines an anterior coil structure and the receive coil array 24b define a posterior coil structure. Accordingly, with the patient positioned within the bore 40, the receive coil array 24a is above the patient 52 and the receive coil array 24b is below the patient 52. It should be noted that some portion of the receive coil array 24a and/or the receive coil array 24b may extend around the patient 52 such as towards a side of the patient 52.

The receive coil arrays 24a and 24b are each mounted on a structure that allows movement of the receive coil arrays 24a and 24b within the bore 40 along the examination axis 60. For example, in one embodiment, the receive coil arrays 24a and 24b are coupled to respective rails 64 along the top and bottom of the bore 40. The rails 64 may be any type of rail structure that allow movement of the receive coil arrays 24a and 24b. It should be noted that the rails 64 may extend along the entire length of the bore 40 or may only extend along a portion of the length of bore 40 as shown in FIG. 2. For example, in the embodiment of FIG. 2 the receive coil arrays 24a and 24b may be moved to the end 62a of the bore 40, but only a distance towards the end 62b. However, as described below and illustrated, for example, in FIG. 4, the rails 64 may extend the entire length of the bore 40.

The receive coil arrays 24a and 24b may be movably coupled to the rails 64 in any suitable manner to allow movement of the receive coil arrays 24a and 24b within the bore 40.

For example, in one embodiment, the receive coil array 24 is coupled to a support structure or base 66 via one or more actuators 70 (e.g., a pneumatic lifting and lowering mechanism) as described in more detail herein to also allow radial movement of the receive coil array 24a, and more particularly, the coil array portions 58. The base 66 is then coupled to the rail 64 using one or more wheels 68 or other rolling or sliding members that allow the receive coil array 24a to translate along the rail 64 within the bore 40. Additionally, the receive coil array 24b similarly has wheels 68 or other rolling or sliding members to movably couple the receive coil array 24b to the respective rail 64. It should be noted that the receive coil array 24b in the illustrated embodiment is fixed radially within the bore 40 such that no actuating devices are provided. Accordingly, the receive coil array 24b may be mounted to a movable structure (e.g., a platform) having the wheels 68 or directly to the wheels 68. It should be noted that the receive coil array 24b may similarly include an actuating device, such as one or more actuators 70 to allow radial movement of the receive coil array 24b in other embodiments.

In various embodiments, as described in more detail below, the receive coil array 24a is configured for positioning in different radial and axial positions within the bore 40 and the receive coil array 24b is configured for positioning at different axial positions within the bore 40. The positioning of the receive coil array 24a and the receive coil array 24b may be controlled by the controller 42 (shown in FIG. 1), which may be based on, for example, a user input or an automatic scan protocol. The receive coil array 24a and the receive coil array 24b may be moved or positioned simultaneously, concurrently or separately. Additionally, the receive coil array 24a and the receive coil array 24b may be aligned generally at the same point along the examination axis 60 or at different points along the examination axis 60 and within the bore 40.

The receive coil arrays 24a and 24b may be sized and shaped as desired or needed, for example, based on the requirements of the MRI system. In one embodiment, for example, the receive coil arrays 24a and 24b have a length of about 45 cm and a width of about 50 cm. However, any other dimension or shape may be provided for the receive coil arrays 24a and 24b.

Additionally, in some embodiments, a Positron Emission Tomography (PET) detector 80 may be provided. For example, the PET detector 80 may include one or more rings of PET detecting elements. The PET detector 80 in one embodiment is positioned radially inward from the transmit coil 22 and radially outward from the rails 64. Thus, the PET detector 80 in this embodiment is between the transmit coil 22 and the receive coil arrays 24a and 24b. Although the PET detector 80 is shown as positioned generally at a middle and equidistance from the ends 62 of the bore 40, the PET detector 80 may be positioned at a different axial positioned along the examination axis 60. Additionally, the PET detector 80 may have different sizes. For example, in one embodiment, the PET detector has a width of about 25 cm to about 30 cm.

Thus, in various embodiments, the receive coil arrays 24a and 24b may be moved out of a FOV within the bore 40, for example, out of the FOV of the transmit coil 22 and/or the PET detector 80 while remaining within the bore 40. For example, the receive coil arrays 24a and 24b may be moved towards or to one of the ends 62 of the bore 40 while remaining within the footprint of the bore 40. The receive coil arrays 24a and 24b may be moved out of the FOV, for example, when performing PET scanning of the patient 52 using the PET detector 80. As another example, the receive coil arrays 24a and 24b may be moved out of the FOV of the transmit coil 22 when other receive coils are used, such as surface receive coils that are positioned on the patient 52 (e.g., a head, shoulder, hip, wrist or ankle specialty receive coil). Thus, a reduction of gamma attenuation for PET imaging may be provided and/or allowing scanning with local transmit or receive coils, such that the coupling between the different RF coils, for example the receive coil array 24a and/or 24b and the surface receive coil, is reduced or eliminated. In one embodiment, for example, the bore 40 has a length of about 1.5 meters (m) while the FOV is less than about 50 cm for MRI and about 25 cm for PET imaging. Accordingly, the receive coil arrays 24a and 24b may be moved, such as translated entirely outside of the FOV.

Figure 3:
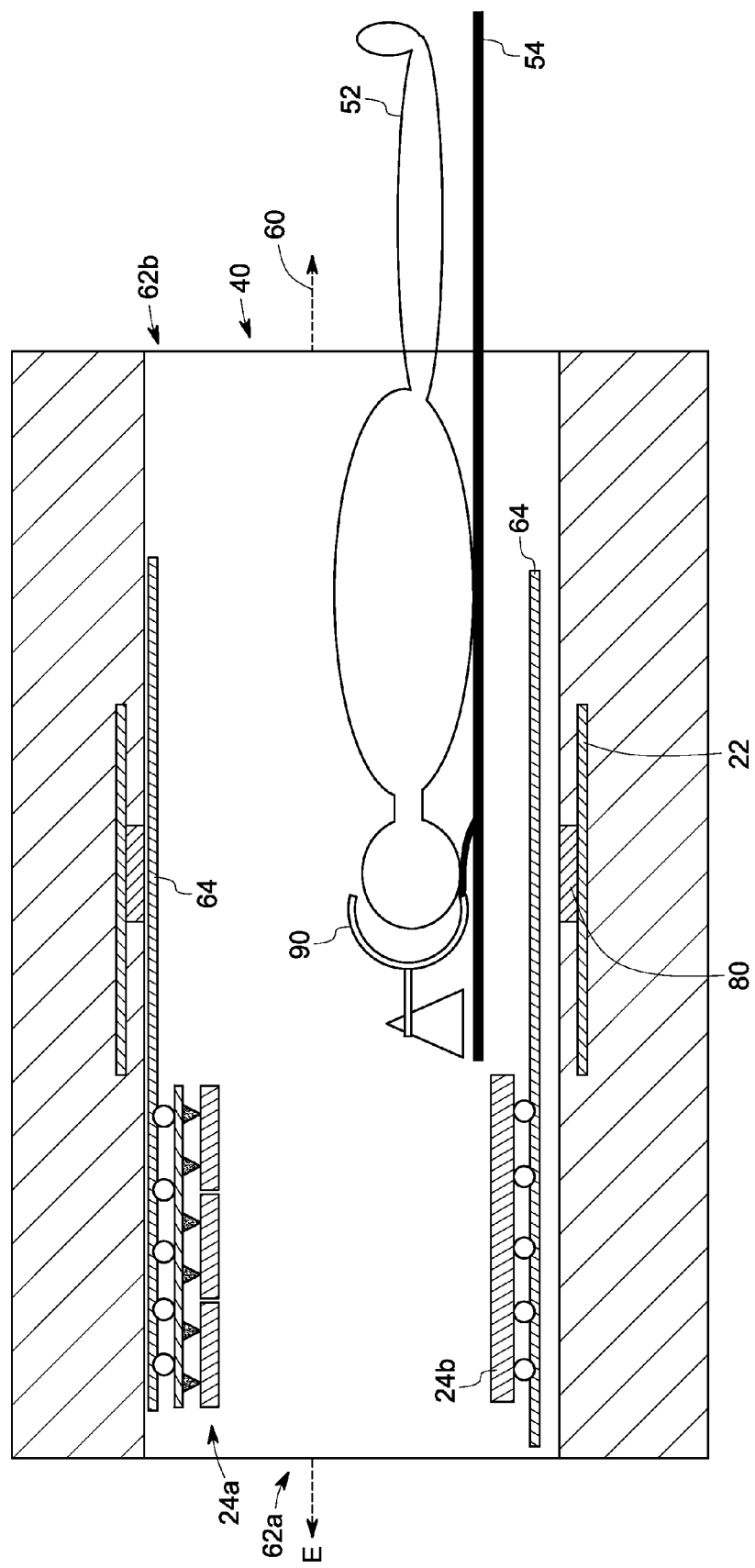
FIG. 3 is a schematic diagram of a coil arrangement illustrating movement of coils in accordance with various embodiments.

In operation, for example as shown in FIG. 3, the receive coil arrays 24a and 24b may be moved along the rails 64 and outside of the FOV of the transmit coil 22 and the PET detector 80. In the illustrated embodiment, the receive coil arrays 24a and 24b are moved left (as viewed in FIG. 3) within the bore 40 away from the head of the patient 52. As can be seen, a specialty RF coil, for example, a head coil 90 may then be moved or positioned at the head of the patient 52 to perform MRI. However, in other embodiments, the receive coil arrays 24a and 24b are moved out of the FOV of the PET detector 80 to allow PET imaging. Thus, the patient 52 may be maintained and supported in a fixed position on the table 54 while performing different scans or different types of imaging.

Figure 4:
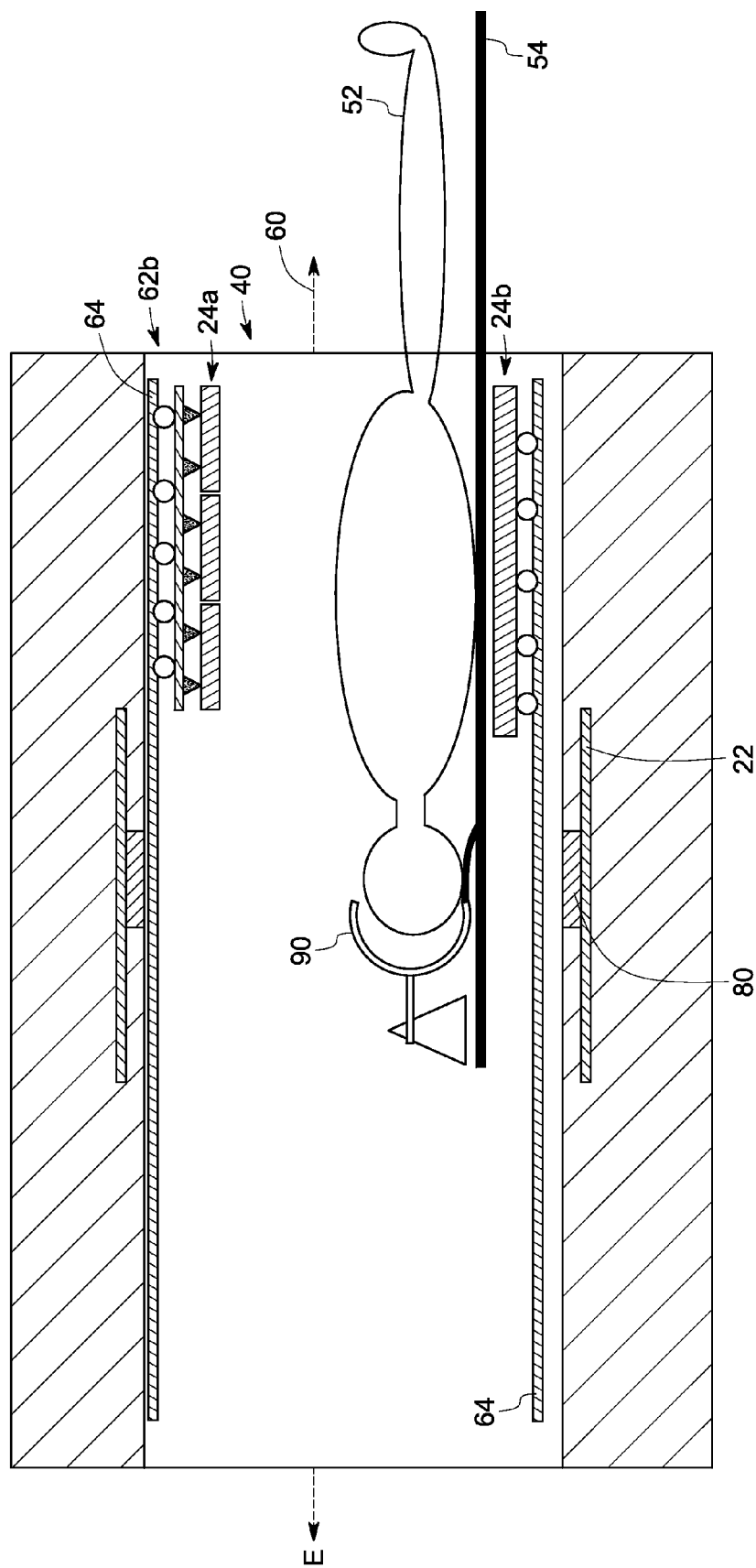
FIG. 4 is another schematic diagram of a coil arrangement illustrating movement of coils in accordance with various embodiments.

It should be appreciated that although the rails 64 are shown as extending to the end 62a, the rails may extend to both ends 62a and 62b of the bore 40 or to the end 62b instead of 62a. For example, as shown in FIG. 4, the rails 64 may extend to both ends 62a and 62b of the bore 40. In this embodiment, the receive coil arrays 24a and 24b may be moved out of the FOV in either direction along the examination axis 60 (left or right as viewed in FIG. 3). For example, the receive coil arrays 24a and 24b may be moved in a particular direction based on the types of additional scans to be performed, the location of the patient 52 in the bore 40, among others.

Figure 5:
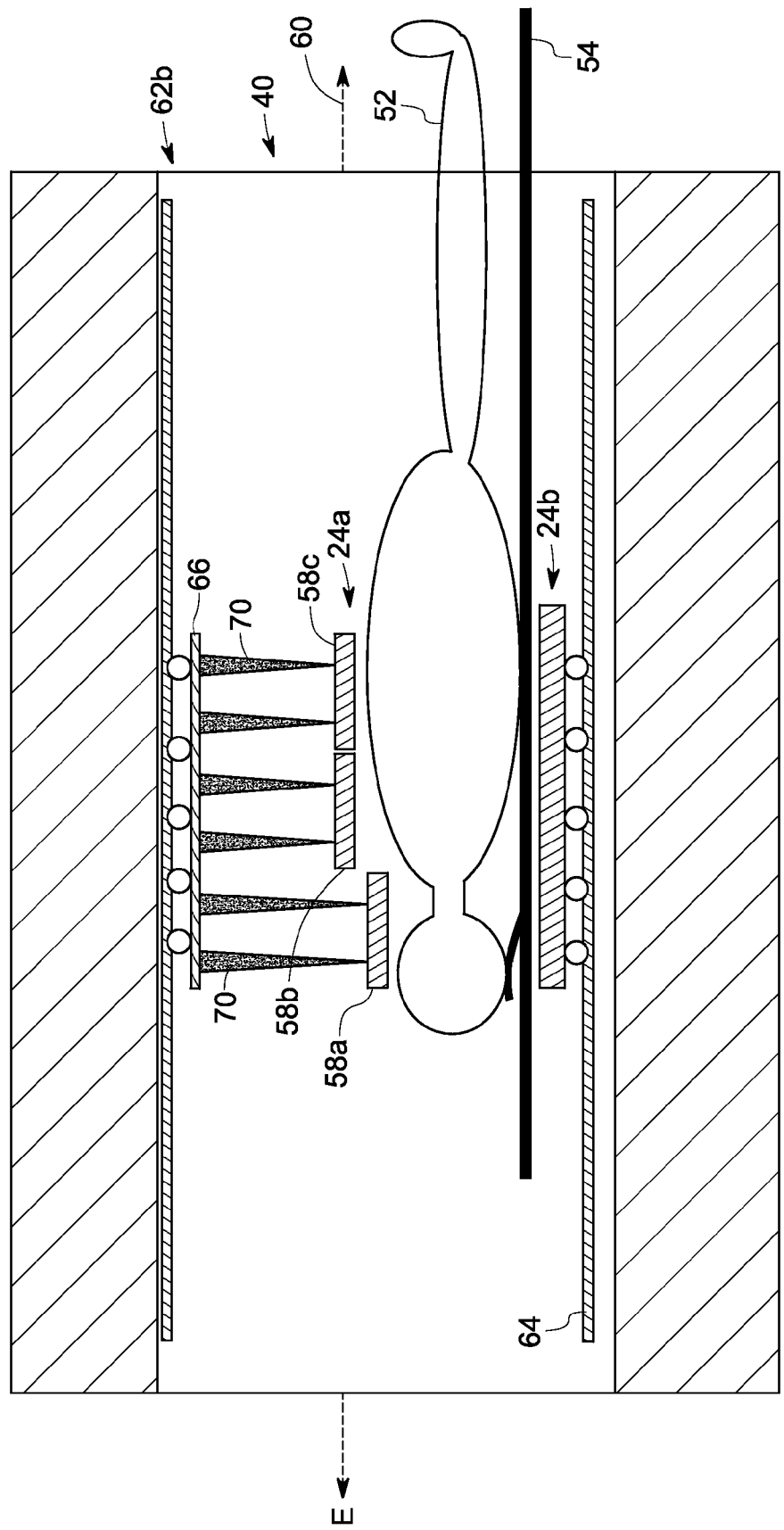
FIG. 5 is another schematic diagram of a coil arrangement illustrating movement of coils in accordance with other various embodiments.

With respect to the radial movement of the receive coil array 24, the coil array portions 58 are movable radially, such that the coil array portions 58 may be moved toward or away from the patient 52 within the bore 40 as shown in FIG. 5. It should be noted that several of the components have been removed for ease of illustration, including the transmit coil 22, the PET detector 80, and the rails 64 and associated components.

As illustrated, each of the coil array portions 58 is separately movable and positionable within the bore 40. For example, each of the coil array portions 58 may be moved by one or more respective actuators 70 (two are shown for each coil array portions 58 for illustration) a different distance, such that the coil array portions 58 are positioned adjacent a portion of the patient 52, which may be at different heights or radial distances from the circumference of the bore 40. For example, the coil array portion 58a may move a greater distance downward (as viewed in FIG. 5) than the coil array portions 58b and 58c, such that the coil array portion 58a is positioned in close proximity to the neck of the patient 52 and the coil array portions 58b and 58c are positioned in close proximity to the body of the patient. It should be noted that while the coil array portions 58b and 58c are shown positioned at a same location, the locations may be different, such as based on the curvature of the patient 52. In one embodiment, the coil array portions 58 are moved and positioned adjacent to, but not touching the patient 52. The coil array portions 58 likewise may be moved if a different portion of the patient 52 is imaged.

Figure 6:
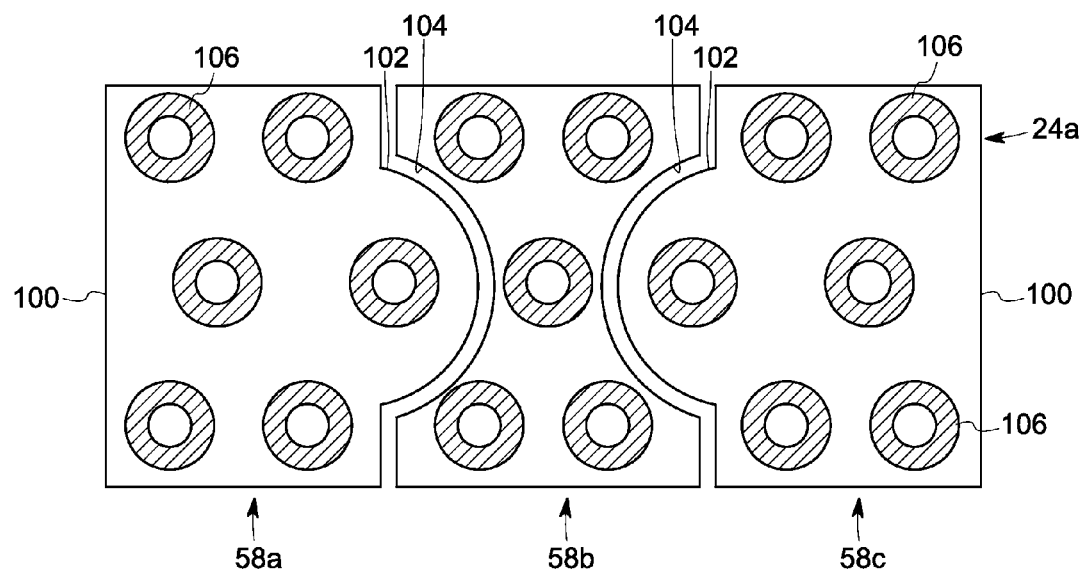
FIG. 6 is a schematic diagram of a receive coil array in accordance with various embodiments.
Figure 7:
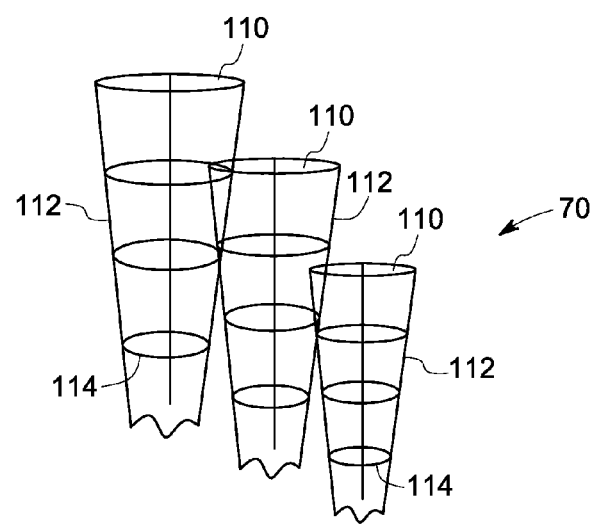
FIG. 7 is a diagram of actuators in accordance with various embodiments.

The coil array portions 58 may be configured having different shapes and sizes. For example, in one embodiment, the coil array portions 58 are provided as shown in FIG. 6 to form the receive coil array 24a. However, it should be appreciated that different shapes and sizes may be provided. In this embodiment, the coil array portions 58a and 58c have the same shape, which is illustrated as a generally rectangular portion 100 having a semi-circular protuberance 102 along on side (illustrated as the side facing the coil array portion 58b). The coil array portion 58b had a generally "I" or hour-glass shape with semi-circular recesses 104 (e.g., cut-outs) on opposite sides that correspond to or accommodate the circular protuberances 102 therein. The semi-circular protuberances 102 and recesses 104 may have different sizes, for example, extend along more or less of the length of the sides or more or less out from or in from the sides. In the illustrated embodiment, the shapes of the coil array portions 58 with the semi-circular protuberances 102 and recesses 104 may accommodate confinement or positioning around the neck and pelvis of the patient 52. It should be noted that the semi-circular protuberances 102 and recesses 104 in various embodiments are adjacent one another or may abut one another.

As can be seen, ends 106 of the actuators 70 are coupled to each of the coil array portions 58 to provide movement of the coil array portions 58 towards and away from the patient 52. For example, the actuators 70 may be pneumatic actuators or other actuating devices that may lift or lower (e.g., push down) the coil array portions 58 away from or towards the patient 52, respectively. For example, the actuators 70 may be conical or frustoconical devices 110, which are illustrated as plastic hose structures. It should be noted that although the devices 110 are illustrated as having individual tubes 112 that form the length, which may include support rings 114, the devices 110 may have different shapes and configurations. In one embodiment, when a pressure is applied to the devices 110, the coil array portions 58 are pushed downward toward the patient 52 and when the pressure is reduced or removed the coil array portions 58 are moved away from the patient 52. It should be noted that different non-pneumatic arrangements may be used, such as mechanical actuators.

Thus, various embodiments provide a coil arrangement, in particular, an RF receive coil arrangement, wherein anterior and posterior receive coils may move along an examination axis within a bore of an MRI system, while staying within in the bore. Additionally, at least one of the receive coils, for example, the anterior receive coil may be moved towards or away from the patient. Additionally, the movement of the receive coils may be provided while the patient is within the bore. The various embodiments may form a system centric coil suite.

Figure 8:
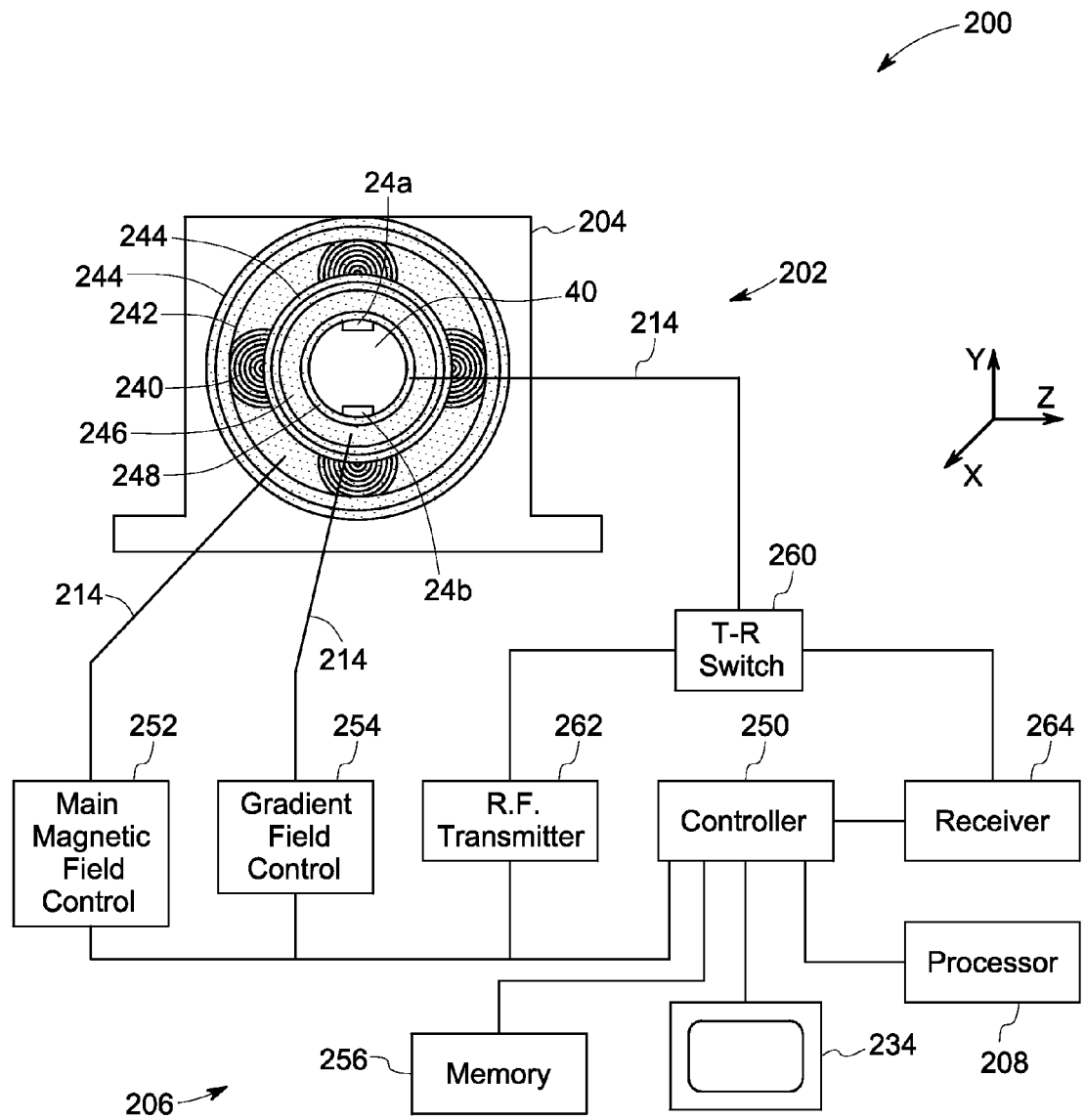
FIG. 8 is a schematic diagram of an exemplary medical imaging system in accordance with various embodiments.

Various embodiments may be provided as part of, or used with, a medical imaging system, such as the imaging system 200 shown in FIG. 8. It should be appreciated that although the imaging system 200 is illustrated as a single modality imaging system, the various embodiments may be implemented in or with multi-modality imaging systems. The imaging system 200 is illustrated as an MRI imaging system. Moreover, the various embodiments are not limited to medical imaging systems for imaging human subjects, but may include veterinary or non-medical systems for imaging non-human objects, luggage, etc.

Referring to FIG. 8, the imaging system 200 includes an imaging portion 202 having an imaging unit 204 (e.g., imaging scanner) and a processing portion 206 that may include a processor 208 or other computing or controller device. In particular, the imaging unit 204 enables the imaging system 200 to scan an object or patient to acquire image data, which may be image data of all or a portion of the object or patient. The imaging unit 204 includes one or more imaging components that allow acquisition of image data. The imaging components produce signals that represent image data that is communicated to the processing portion 206 via one or more communication links 214 that may be wired or wireless. The patient may be positioned within the bore 40 using, for example, a motorized table and then MR imaging performed as described in more detail herein, which may include moving the receive coil arrays 24a and 24b.

In operation, an output of one or more of the imaging components is transmitted to the processing portion 206, and vice versa, which may include transmitting signals to or from the processor through a control interface 220, which may be embodied as the system interface 30 (shown in FIG. 1). The processor 208 also may generate control signals for controlling the position of the motorized table, imaging components and/or receive coil arrays 24a and 24b based on user inputs or a predetermined scan. For example, RF signals or transmit pulses may be communicated through the one or more communication link 214.

During a scan, image data, such as magnetic resonance image data from the imaging components may be communicated to the processor 208 through a data interface via the control interface, for example, as acquired by a body coil or surface coil.

The processor 208 and associated hardware and software used to acquire and process data may be collectively referred to as a workstation. The workstation may include, for example, a keyboard and/or other input devices such as a mouse, a pointer, and the like, and a monitor 234. The monitor 234 displays image data and may accept input from a user if a touchscreen is available.

In the exemplary embodiment, the imaging system 200 also includes a superconducting magnet 240 (e.g., the magnet 50) fanned from magnetic coils supported on a magnet coil support structure. However, in other embodiments, different types of magnets may be used, such as permanent magnets or electromagnets. A vessel 242 (also referred to as a cryostat) surrounds the superconducting magnet 240 and is filled with liquid helium to cool the coils of the superconducting magnet 240. A thermal insulation 244 is provided surrounding the outer surface of the vessel 242 and the inner surface of the superconducting magnet 240. A plurality of magnetic gradient coils 246 are provided within the superconducting magnet 240 and an RF transmit coil 248 (which may be embodied as the transmit coil 22) is provided within the plurality of magnetic gradient coils 146. In some embodiments the RF transmit coil 248 may operate as a receive coil. Additionally, the receive coil arrays 24 are provided within the RF transmit coil 248. It should be noted that although the superconducting magnet 240 is a cylindrical shape, other shapes of magnets can be used.

The processing portion 206 also generally includes a controller 250, a main magnetic field control 252, a gradient field control 254, a memory 256, the display device 234, a transmit-receive (T-R) switch 260, an RF transmitter 262 and a receiver 264.

In operation, a body of an object, such as the patient 52 or a phantom to be imaged, is placed in the bore 40 on a suitable support, for example, a motorized table or other patient table. The superconducting magnet 240 produces a uniform and static main magnetic field $B_o$ across the bore 40. The strength of the electromagnetic field in the bore 40 and correspondingly in the patient, is controlled by the controller 250 via the main magnetic field control 252, which also controls a supply of energizing current to the superconducting magnet 240.

The magnetic gradient coils 246, which include one or more gradient coil elements, are provided so that a magnetic gradient can be imposed on the magnetic field $B_o$ in the bore 40 within the superconducting magnet 240 in any one or more of three orthogonal directions x, y, and z. The magnetic gradient coils 246 are energized by the gradient field control 254 and are also controlled by the controller 250.

The RF transmit coil 248 is arranged to transmit RF magnetic pulses and/or optionally detect MR signals from the patient if receive coil elements are not provided or moved from the FOV. In various other embodiments, the receive coil arrays 24 detect the MR signals. The RF transmit coil 148 and the receive coil arrays 24 are selectably interconnected to one of the RF transmitter 262 or receiver 264, respectively, by the T-R switch 260. The RF transmitter 262 and T-R switch 260 are controlled by the controller 250 such that RF field pulses or signals that are generated by the RF transmitter 262 are selectively applied to the patient for excitation of magnetic resonance in the patient.

Following application of the RF pulses, the T-R switch 260 is again actuated to decouple the RF transmit coil 248 from the RF transmitter 262. The detected MR signals are in turn communicated to the controller 250. The controller 250 includes a processor (e.g., image reconstruction processor), for example the processor 208, that controls the processing of the MR signals to produce signals representative of an image of the patient.

The processed signals representative of the image are also transmitted to the display device 234 to provide a visual display of the image. Specifically, the MR signals fill or form a k-space that is Fourier transformed to obtain a viewable image. The processed signals representative of the image are then transmitted to the display device 234.

Figure 9:
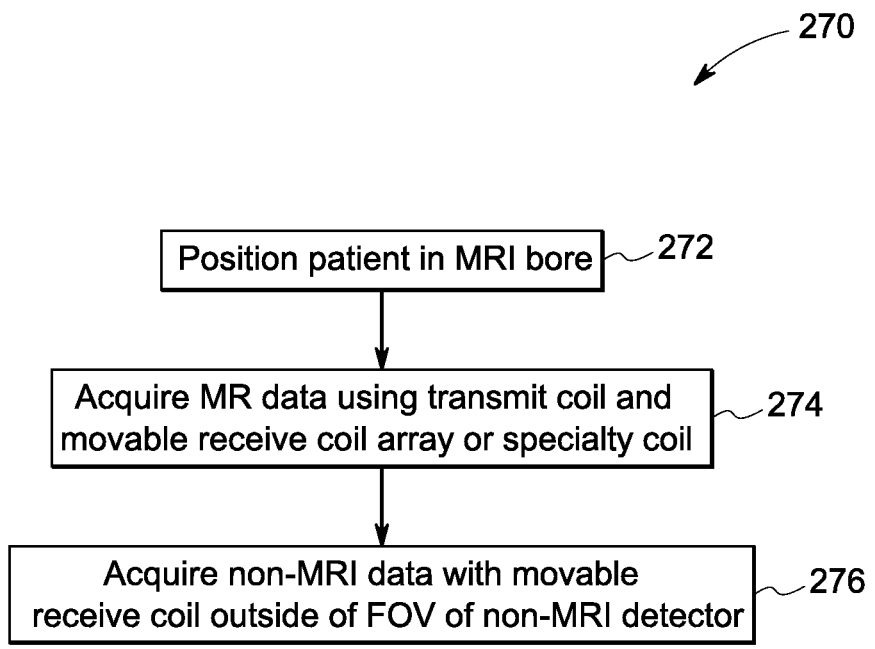
FIG. 9 is a flowchart of a method for performing imaging in accordance with various embodiments.

Various embodiments also provide a method 270 as shown in FIG. 9 for performing imaging, for example, medical imaging of a patient. In particular, the method includes positioning a patient within an MRI bore at 272, for example, within a magnet bore as described herein that includes movable RF receive coil arrays. Thereafter, MR data is acquired at 274 using a transmit coil and either the movable RF receive coil arrays or a specialty RF receive coil coupled or positioned on the patient as described herein. When MR data is acquired with the specialty RF receive coil, the movable RF receive coil arrays are moved out of the FOV of the transmit coil.

The method 270 also includes acquiring non-MRI data at 276 with the movable RF receive coil arrays moved outside of the FOV of the non-MRI detector. For example, in one embodiment, as described herein, the movable RF receive coil arrays are moved out of the FOV of a PET detector and PET data acquired. It should be noted that steps 274 and 276 may be performed in any order and also iteratively.

The various embodiments and/or components, for example, the modules, or components and controllers therein, also may be implemented as part of one or more computers or processors. The computer or processor may include a computing device, an input device, a display unit and an interface, for example, for accessing the Internet. The computer or processor may include a microprocessor. The microprocessor may be connected to a communication bus. The computer or processor may also include a memory. The memory may include Random Access Memory (RAM) and Read Only Memory (ROM). The computer or processor further may include a storage device, which may be a hard disk drive or a removable storage drive such as an optical disk drive, solid state disk drive (e.g., flash RAM), and the like. The storage device may also be other similar means for loading computer programs or other instructions into the computer or processor.

As used herein, the term "computer" or "module" may include any processor-based or microprocessor-based system including systems using microcontrollers, Reduced Instruction Set Computers (RISC), Application Specific Integrated Circuits (ASICs), logic circuits, and any other circuit or processor capable of executing the functions described herein. The above examples are exemplary only, and are thus not intended to limit in any way the definition and/or meaning of the term "computer".

The computer or processor executes a set of instructions that are stored in one or more storage elements, in order to process input data. The storage elements may also store data or other information as desired or needed. The storage element may be in the form of an information source or a physical memory element within a processing machine.

The set of instructions may include various commands that instruct the computer or processor as a processing machine to perform specific operations such as the methods and processes of the various embodiments. The set of instructions may be in the form of a software program, which may form part of a tangible non-transitory computer readable medium or media. The software may be in various forms such as system software or application software. Further, the software may be in the form of a collection of separate programs or modules, a program module within a larger program or a portion of a program module. The software also may include modular programming in the form of object-oriented programming. The processing of input data by the processing machine may be in response to operator commands, or in response to results of previous processing, or in response to a request made by another processing machine.

As used herein, the terms "soft-ware" and "firmware" are interchangeable, and include any computer program stored in memory for execution by a computer, including RAM memory, ROM memory, EPROM memory, EEPROM memory, and non-volatile RAM (NVRAM) memory. The above memory types are exemplary only, and are thus not limiting as to the types of memory usable for storage of a computer program.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the various embodiments without departing from their scope. While the dimensions and types of materials described herein are intended to define the parameters of the various embodiments, they are by no means limiting and are merely exemplary. Many other embodiments will be apparent to those of skill in the art upon reviewing the above description. The scope of the various embodiments should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112, sixth paragraph, unless and until such claim limitations expressly use the phrase "means for" followed by a statement of function void of further structure.

This written description uses examples to disclose the various embodiments, including the best mode, and also to enable any person skilled in the art to practice the various embodiments, including making and using any devices or systems and performing any incorporated methods. The patentable scope of the various embodiments is defined by the claims, and may include other examples that occur to those skilled in the art. Such other examples are intended to be within the scope of the claims if the examples have structural elements that do not differ from the literal language of the claims, or the examples include equivalent structural elements with insubstantial differences from the literal languages of the claims.

What is claimed is:

1. A magnetic resonance imaging (MRI) system comprising:
   an imaging portion having a magnet bore;
   a radio-frequency (RF) transmit coil coupled to the magnet bore; and
   an anterior RF receive coil and a posterior RF receive coil coupled to the magnet bore, the anterior and posterior RF receive coils movable within the magnet bore along an examination axis, the anterior RF receive coil further movable radially within the magnet bore.

2. The MRI system of claim 1, further comprising a plurality of anterior coil array portions, each including at least one RF receive coil, the coil array portions individually movable radially within the magnet bore.

3. The MRI system of claim 2, further comprising pneumatic actuators coupled to the coil array portions and configured to individually move the coil array portions.

4. The MRI system of claim 1, further comprising one or more rails along a top and bottom of the magnet bore, wherein the anterior RF receive coil and the posterior RF receive coil are coupled to the top and bottom rails, respectively, and configured to move along an examination axis within the magnet bore.

5. The MRI system of claim 1, wherein the anterior and posterior RF receive coils are configured to move outside of a field of view (FOV) of the RF transmit coil.

6. The MRI system of claim 5, further comprising a Positron Emission Tomography (PET) detector and the anterior and posterior RF receive coils are configured to move outside of a field of view (FOV) of the PET detector.

7. The MRI system of claim 1, further comprising a plurality of anterior coil array portions, each including at least one RF receive coil, wherein a pair of coil array portions have semi-circular protuberances that correspond to semi-circular recesses in a coil array portion therebetween.

8. A coil arrangement for a Magnetic Resonance Imaging (MRI) system, the coil arrangement comprising:
   a magnet bore;
   a radio-frequency (RF) transmit coil coupled to the magnet bore;
   at least one RF receive coil coupled to the magnet bore, the RF receive coil movable within the magnet bore; and
   one or more rails along a top and bottom of the magnet bore, wherein the at least one RF receive coil comprises an anterior coil array and a posterior coil array coupled to the top and bottom rails, respectively, and configured to move along an examination axis within the magnet bore.

9. The coil arrangement of claim 8, wherein the at least one RF receive coil comprises a posterior coil array configured to move along an examination axis within the magnet bore.

10. The coil arrangement of claim 8, wherein the at least one RF receive coil comprises an anterior coil array configured to move along an examination axis within the magnet bore.

11. The coil arrangement of claim 8, wherein the at least one RF receive coil comprises an anterior coil array configured to move radially within the magnet bore.

12. The coil arrangement of claim 11, wherein the anterior coil array comprises a plurality of coil array portions, each of the coil array portions individually movable radially within the magnet bore.

13. The coil arrangement of claim 12, further comprising pneumatic actuators coupled to the coil array portions and configured to individually move the coil array portions.

14. The coil arrangement of claim 8, wherein the at least one RF receive coil comprises a posterior coil array and an anterior coil array, wherein the posterior and anterior coil arrays are configured to move axially within the magnet bore and the anterior coil array is further configured to move radially within the magnet bore.

15. The coil arrangement of claim 8, wherein the at least one RF receive coil is configured to move outside of a field of view (FOV) of the RF transmit coil.

16. The coil arrangement of claim 8, further comprising a Positron Emission Tomography (PET) detector configured to acquire PET data within the magnet bore and the at least RF receive coil is configured to move outside of a field of view (FOV) of the PET detector.

17. The coil arrangement of claim 8, wherein the at least one RF receive coil comprises an anterior coil array having a plurality of coil array portions, wherein a pair of coil array portions have semi-circular protuberances that correspond to semi-circular recesses in a coil array portion therebetween.

* * * * *